United States Patent
Yu et al.

(10) Patent No.: US 7,193,327 B2
(45) Date of Patent: Mar. 20, 2007

(54) BARRIER STRUCTURE FOR SEMICONDUCTOR DEVICES

(75) Inventors: Chen-Hua Yu, Hsin-Chu (TW); Shing-Chyang Pan, Hsinchu County (TW); Shau-Lin Shue, Hsinchu (TW); Ching-Hua Hsieh, Hsinchu (TW); Cheng-Lin Huang, Hsinchu (TW); Hsien-Ming Lee, Changhua (TW); Jing-Cheng Lin, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 102 days.

(21) Appl. No.: 11/042,396

(22) Filed: Jan. 25, 2005

(65) Prior Publication Data
US 2006/0163746 A1    Jul. 27, 2006

(51) Int. Cl.
*H01L 23/48* (2006.01)
*H01L 23/52* (2006.01)
*H01L 29/40* (2006.01)

(52) U.S. Cl. .................... 257/774; 257/758; 257/761; 257/763; 257/767; 257/E21.585

(58) Field of Classification Search ................ 257/774, 257/758, 761, 763, 767
See application file for complete search history.

(56) References Cited
U.S. PATENT DOCUMENTS

| | | | |
|---|---|---|---|
| 6,146,991 A | 11/2000 | Cheng et al. | |
| 6,191,025 B1 | 2/2001 | Liu et al. | |
| 6,204,179 B1 * | 3/2001 | McTeer | 438/687 |
| 6,395,642 B1 | 5/2002 | Liu et al. | |
| 6,607,977 B1 | 8/2003 | Rozbicki et al. | |
| 6,624,066 B2 | 9/2003 | Lu et al. | |
| 6,713,835 B1 * | 3/2004 | Horak et al. | 257/522 |
| 6,755,945 B2 | 6/2004 | Yasar et al. | |
| 6,900,539 B2 * | 5/2005 | Motoyama | 257/751 |
| 2002/0084526 A1 * | 7/2002 | Kasai | 257/758 |

OTHER PUBLICATIONS

Alers, G.B., et al., "Barrier-First Integration for Improved Reliability in Copper Dual Damascene Interconnects," IEEE (2003) pp. 27-29.

Fischer, A.H., et al., "Electromigration Failure Mechanism Studies on Copper Interconnects," IITC (2002) pp. 139-141.

(Continued)

*Primary Examiner*—Nitin Parekh
(74) *Attorney, Agent, or Firm*—Slater & Matsil, L.L.P.

(57) ABSTRACT

An opening in a dielectric layer having a unique barrier layer structure is provided. In an embodiment, the opening is a via and a trench. The barrier layer, which may comprise one or more barrier layers, is formed such that the ratio of the thickness of the barrier layers along a sidewall approximately midway between the bottom of the trench and the top of the dielectric layer to the thickness of the barrier layers along the bottom of the trench is greater than about 0.55. In another embodiment, the ratio of the thickness of the barrier layers along a sidewall approximately midway between the bottom of the trench and the top of the dielectric layer to the thickness of the barrier layers along the bottom of the via is greater than about 1.0. An underlying conductive layer may be recessed.

17 Claims, 3 Drawing Sheets

OTHER PUBLICATIONS

Hu, C.-K., et al., "Bimodal Electromigration Mechanisms in Dual-Damascene Cu Line/Via on W," IITC (2002) pp. 133-135.

Ishikawa, K., et al., "Electromigration Resistance Improvement of Dual-Damascene Copper Interconnection Using TaN/Ta Barrier Formed by Ionized Bias Sputtering," Conference Proceedings ULSI XVII, Materials Research Society (2002) pp. 487-492.

Lim, B.K., et al., "Study of Ultrathin Ta Diffusion Barrier for Cu Interconnects," VMIC Conference (Nov. 19-20, 2002) pp. 325-332.

Lin, J.C., et al., "Electromigration Reliability Study of Self-Ionized Plasma Barriers for Dual Damascene Cu Metallization," Conference Proceedings ULSI XVII, Materials Research Society (2003) pp. 233-237.

Musaka, K., et al., "Thermal Stress and Reliability Characterization of Barriers for Cu Interconnects," IITC (2001) pp. 83-85.

Okada, N., et al., "Thermal Stress of 140nm-Width Cu Damascene Interconnects," IITC (2002) pp. 136-138.

Park, B.-L., et al., "Mechanisms of Stress-Induced Voids in Multi-Level Cu Interconnects," IITC (2002) pp. 130-132.

Sidhwa, A., et al., "Reduction In Contact Resistance By Using A Modified Barrier Process And Understanding The Step Coverage Limitations Using The EVOLVE Simulation Program," VMIC Conference (Nov. 19-20, 2002) pp. 343-346.

Son, J.-H., et al., "A Study Of Via Bottom Profile On Via Failure In Multi-Level Cu Interconnection," Conference Proceedings ULSI XVII, Materials Research Society (2002) pp. 227-231.

Tökei, Zs., et al., "Step Coverage And Continuity Of An I-PVD Ta(N) Barrier Layer: Limitations," IITC (2001) pp. 213-215.

Yamagishi, H., et al., "TEM/SEM Investigation And Electrical Evaluation Of A Bottomless I-PVD Ta(N) Barrier in Dual Damascene," Conference Proceedings ULSI XXI, Materials Research Society (2001) pp. 279-285.

Yuan, Z.L., et al., "Formation of Cubic Ta Diffusion Barrier for Cu Metallization," VMIC Conference (Nov. 19-20, 2002) pp. 363-366.

Kim, D.-Y., et al., "Mechanism for Early Failure in Cu Dual Damascene Structure," IITC (2003) pp. 265-267.

Woo, S.W., et al., "Integrity of Ultrathin TiN Diffusion Barrier by Atomic Layer Deposition for Cu Metallization," VMIC Conference (Nov. 19-20, 2002) pp. 347-350.

Lian, W., et al., "Comparison of Titanium Liner Quality of SIP (Self-Ionized Plasma), IMP and Collimator on DRAM Device," VMIC Conference (Nov. 19-20, 2002) pp. 359-362.

Photograph of First Commercially-Available Chip, Sep. 29, 2003, 3 pages.

Photograph of Second Commercially-Available Chip, Jun. 27, 2003, 1 page.

Photograph of Third Commercially-Available Chip, date unknown, 2 pages.

* cited by examiner

BARRIER STRUCTURE FOR SEMICONDUCTOR DEVICES

TECHNICAL FIELD

The present invention relates generally to semiconductors and, more particularly, to a semiconductor structure with a barrier layer in a damascene opening and a method for forming such a semiconductor structure in an integrated circuit.

BACKGROUND

Interconnect structures in ICs (Integrated Circuit) typically include semiconductor structures, such as transistors, capacitors, resistors, and the like, formed on a substrate. One or more conductive layers, typically formed of a metal or metal alloy, separated by layers of a dielectric material are formed over the semiconductor structures to interconnect the semiconductor structures and to provide external contacts to the semiconductor structures. Vias are formed through the dielectric material to provide electrical connections between conductive layers and to the semiconductor structures.

Barrier layers are frequently used within the vias to prevent or reduce undesirable diffusing of the metal conductor (typically copper or a copper alloy, although other metals or conductors may be employed) into the surrounding dielectric layer (e.g., silicon oxide, FSG, BPSG, a low-k dielectric, or the like). Typically, tantalum and/or tantalum nitride is used as a barrier layer for a copper via/contact structure. Other barrier layers could include titanium, titanium nitride, nitrogen-containing materials, silicon-containing materials or the like.

In conventional processes, a via or contact hole is formed in the dielectric layer, which may comprise a single layer or multiple layers of the same or different materials. The bottom of the via is typically an underlying conductive layer or region, such as an underlying conductor (e.g., copper) of a previously formed conductive layer or an underlying source/drain region or gate electrode of a semiconductor device. The sidewalls of the via are typically formed of the dielectric material in which the hole is formed.

A barrier layer is deposited along the sidewalls and bottom of the via or contact hole. The barrier layer is typically deposited by a process such as chemical vapor deposition (CVD), which results in a barrier layer in which the thickness of the barrier layer on the bottom of the via is thicker than the barrier layer on the sidewalls, where the barrier layer is needed. Because the barrier layer is typically not as ideal of a conductor as the copper material, however, the barrier layer along the bottom undesirably increases the resistance of the resulting contact or via. Variation in the bottom thickness results not only in higher contact resistance, but also in more variation from wafer to wafer and lot to lot in the contact resistance, potentially affecting device reliability and yields.

Therefore, there is a need for a barrier layer that prevents or reduces diffusion along the sidewalls as well as reduces the contact resistance between the via and the underlying conductive material.

SUMMARY OF THE INVENTION

These and other problems are generally solved or circumvented, and technical advantages are generally achieved, by preferred embodiments of the present invention which provides a diffusion barrier layer in a damascene opening.

In an embodiment of the present invention, a barrier structure for an opening formed in a dielectric layer is provided. The barrier layer, which may comprise one or more barrier layers, is formed such that the ratio of the thickness of the barrier layers along a sidewall approximately midway between the bottom of the trench and the top of the dielectric layer to the thickness of the barrier layers along the bottom of the trench is greater than about 0.55. A first barrier layer in contact with the dielectric layer may be partially or completely removed. Furthermore, a recess may be formed in a conductive layer underlying the via.

In another embodiment, the ratio of the thickness of the barrier layers along a sidewall approximately midway between the bottom of the trench and the top of the dielectric layer to the thickness of the barrier layers along the bottom of the via is greater than about 1.0.

In yet another embodiment, a first method of forming a barrier structure for an opening is provided. The method comprises forming a first conductive region, forming a dielectric over the first conductive region, forming an opening in the dielectric, the opening having a via and a trench, the via being in contact with the first conductive region, and forming one or more barrier layers on a surface of the opening, wherein a ratio of a first thickness of the barrier layers along a point approximately midway between a bottom of the trench and the top of the dielectric layer to a second thickness of the barrier layers along a bottom of the via is greater than about 1.0. Optionally, a recess may be formed in a conductive layer underlying the via.

In yet still another embodiment, a second method of forming a barrier structure for an opening is provided. The method comprises forming a first conductive region, forming a dielectric over the first conductive region, forming an opening in the dielectric, the opening having a via and a trench, the via being in contact with the first conductive region, and forming one or more barrier layers on a surface of the opening, wherein a ratio of the thickness of the barrier layers along a sidewall approximately midway between the bottom of the trench and the top of the dielectric layer to the thickness of the barrier layers along the bottom of the trench is greater than about 0.55. Optionally, a recess may be formed in a conductive layer underlying the via.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed herein are merely illustrative of specific ways to make and use the invention, and do not limit the scope of the invention.

Figure 1A:
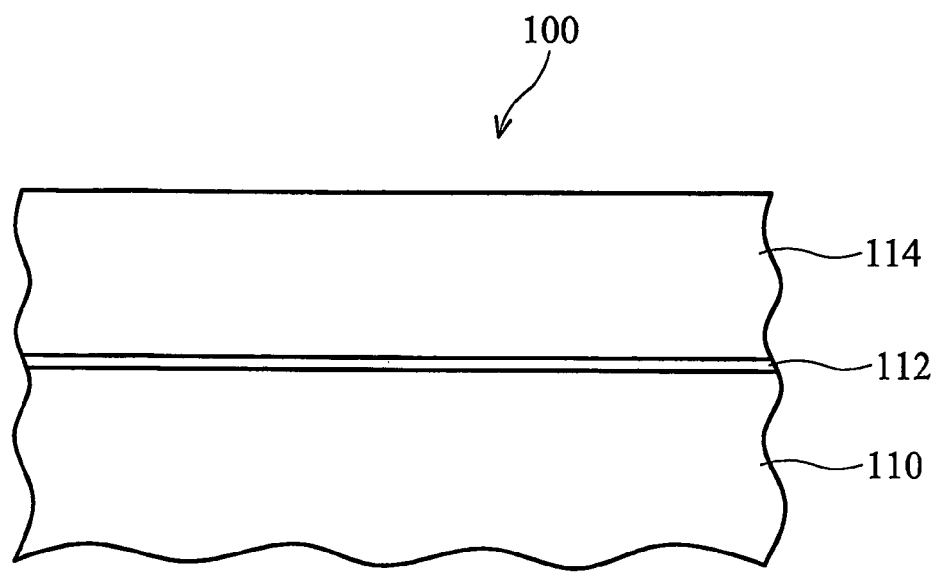
FIGS. 1a–1f illustrate a method to form a barrier layer in a damascene structure in accordance with an embodiment of the present invention.

Referring now to FIG. 1a, a substrate 100 is provided having a conductive layer 110, an etch buffer layer 112, and an IMD layer 114. Although it is not shown, the substrate 100 may include circuitry and other structures. For example, the substrate 100 may have formed thereon transistors, capacitors, resistors, and the like. In an embodiment, the conductive layer 110 is metal layer that is in contact with electrical devices or another metal layer.

The conductive layer 110 may be formed of any conductive material, but an embodiment of the present invention has been found to be particularly useful in applications in which the conductive layer 110 is formed of copper. As discussed above, copper provides good conductivity with low resistance. The etch buffer layer 112 provides an etch stop that may be used to selectively etch the IMD layer 114 in a later processing step. In an embodiment, the etch buffer layer 112 may be formed of a dielectric material such as a silicon-containing material, nitrogen-containing material, carbon-containing material, or the like. The IMD layer 114 is preferably formed of an organic low-K (preferably less than about 3.0) dielectric material, such as carbon-doped silicon oxide. Other materials may be used.

It should be noted that the materials selected to form the conductive layer 110, the etch buffer layer 112, and the IMD layer 114 should be selected such that a high-etch selectivity exists between the IMD layer 114 and the etch buffer layer 112 and between the etch buffer layer 112 and the conductive layer 110. In this manner, shapes may be formed in the layers as described below. Accordingly, in an embodiment, the IMD layer 114 may comprise carbon-doped silicon oxide formed by deposition techniques such as CVD and the etch buffer layer 112 may be formed of silicon nitride ($Si_3N_4$) in an embodiment in which a copper damascene structure is being fabricated.

Figure 1B:
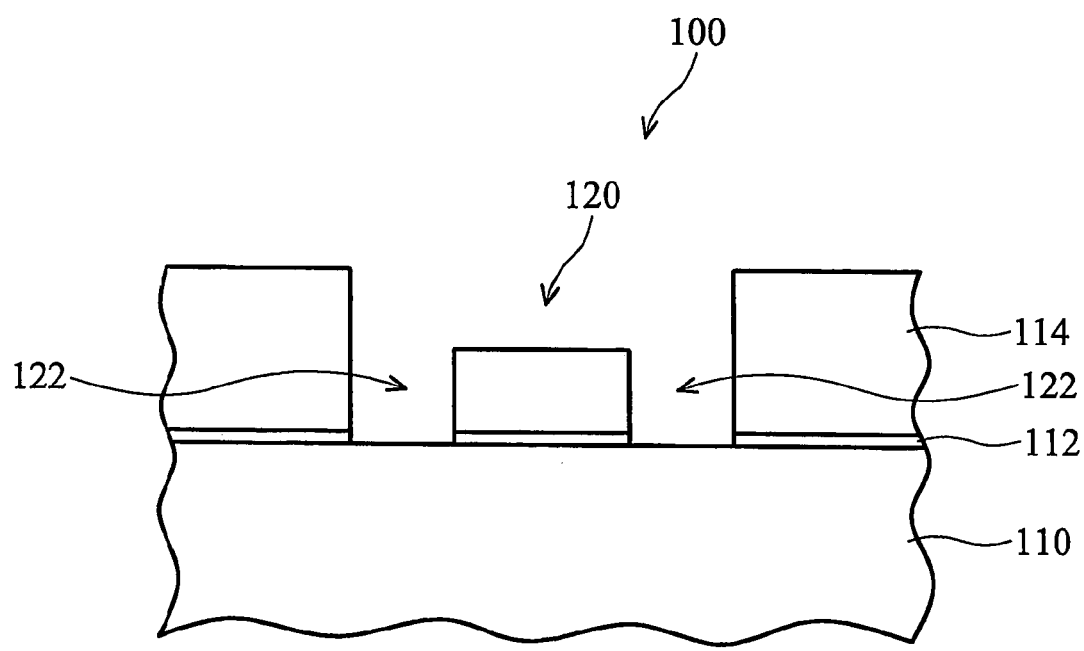

Referring now to FIG. 1b, a trench 120 and vias 122 are formed. The trench is generally considered to be the groove or line formed in the IMD layer 114 in which conductive lines may be formed, and the vias 122 are generally considered to be the portion formed in the IMD layer 114 that provides connectivity between, for example, the conductive line formed in the trench 120 and the underlying conductive layer 110. It should be noted that the trench 120 and vias 122 are illustrated as a single trench having two vias connected thereto formed by a dual-damascene process for illustrative purposes only. The trench 120 may be a different size and/or shape, may have more or fewer vias 122 connected thereto, and may be formed by other processes (e.g., a single-damascene process).

The trench 120 and vias 122 may be formed by photolithography techniques known in the art. Generally, photolithography involves depositing a photoresist material and then irradiating (exposing) and developing it in accordance with a specified pattern to remove a portion of the photoresist material. The remaining photoresist material protects the underlying material from subsequent processing steps, such as etching. The etching process may be a wet or dry, anisotropic or isotropic, etch process, but preferably is an anisotropic dry etch process. After the etching process, the remaining photoresist material may be removed. In a preferred embodiment, the vias 122 have a width along the bottom of less than about 0.14 µm and the trench 120 has a width less than about 1.3 times the width of the bottom of the vias 122.

In an embodiment in which the IMD layer 114 is formed of carbon-doped silicon oxide, the etch buffer layer 112 is formed of silicon nitride, and the conductive layer 110 is formed of copper, the via 122 may be etched using, for example, a solution of $C_4$, $C_5F_8$, or the like, wherein the etch buffer layer 112 acts as an etch buffer. Thereafter, another process utilizing, for example, a solution of $CF_4$, may be performed to remove the etch buffer layer 112 within the via 122, thereby exposing the surface of the conductive layer 110.

It should be noted that an optional pre-clean process may be performed to remove impurities along the sidewalls of the via 122 and to clean the underlying conductive layer 110. The pre-clean process may be a reactive or a non-reactive pre-clean process. For example, a reactive process may include a plasma process using a hydrogen-containing plasma, and a non-reactive process may include a plasma process using an argon-containing plasma.

Figure 1C:
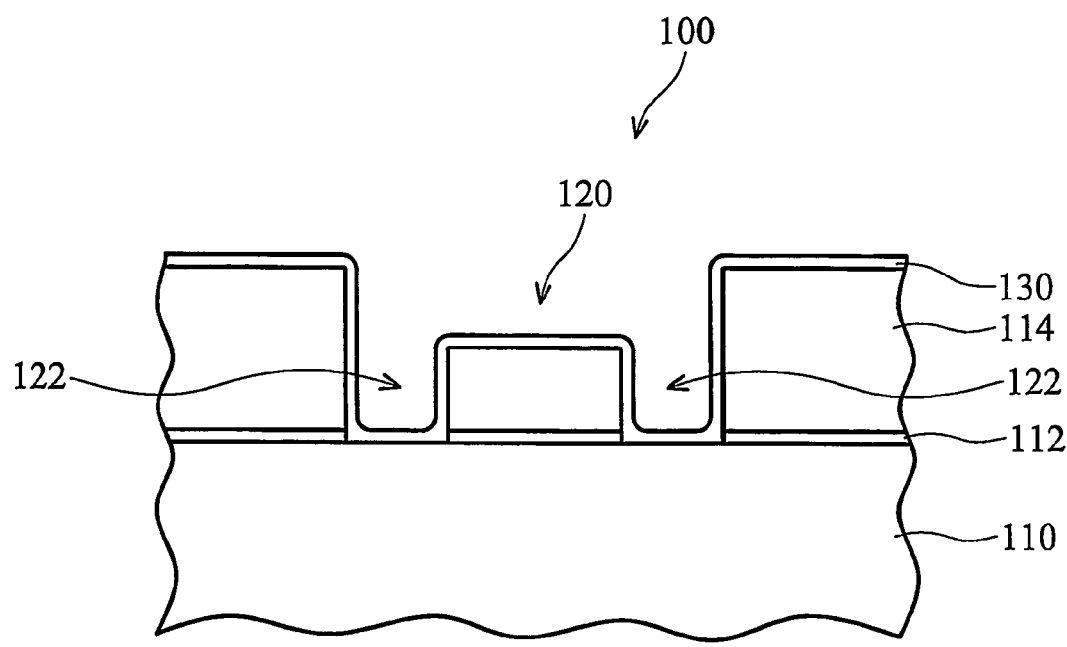

FIG. 1c illustrates the substrate 100 of FIG. 1b after a first barrier layer 130 has been formed. The IMD layer 114 is preferably formed using a low dielectric constant dielectric layer (low-k dielectric, wherein k is less than about 3.0), which is usually a porous material. The porosity of the IMD layer 114 may induce a diffusion path for the conductive material of the conductive layer 110. To prevent or reduce such diffusion of the conductive material into the IMD layer 114, the first barrier layer 130 may be formed along the exposed surfaces of the IMD layer 114 within the trench 120 and vias 122.

In an embodiment, the first barrier layer 130 may comprise a silicon-containing layer, carbon-containing layer, nitrogen-containing layer, hydrogen-containing layer, or a metal or a metal compound containing layer, such as tantalum, tantalum nitride, titanium, titanium nitride, titanium zirconium, titanium zirconium nitride, tungsten, tungsten nitride, or alloys, or combinations thereof. The first barrier layer 130 may be formed by a process such as physical vapor deposition (PVD) or other suitable methods. In a preferred embodiment, the first barrier layer 130 comprises tantalum nitride formed by PVD techniques using a source DC power larger than about 15 KW (preferably greater than about 25 KW) and a pressure greater than about 2 mTorr. Optionally, a substrate bias power larger than about 500 W may be used. The first barrier layer 130 is preferably about 50 Å to about 250 Å in thickness.

Figure 1D:
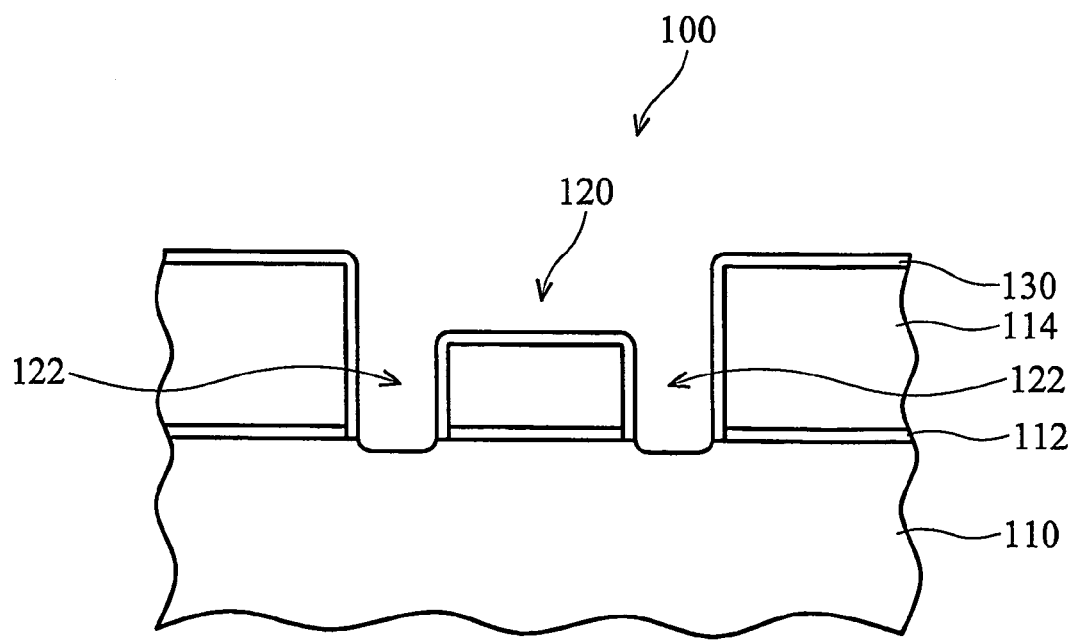

Referring now to FIG. 1d, a process is performed to partially or completely remove the first barrier layer 130 along the bottom of the vias 122. The first barrier layer 130 may be removed along the bottom of the vias 122 by a plasma etch-back process using inert gas plasma, such as argon.

It should be noted that FIG. 1d illustrates the substrate 100 with an optional recess formed in the conductive layer 110. In an embodiment, the depth of the recess portion may be about 50 Å to about 500 Å. The recess may be formed during the etch-back process or by a separate etching process, such as an ion sputter etch process.

Furthermore, it should be noted that a portion of the first barrier layer 130 may be removed along other surfaces, such as the field surfaces (e.g., along the top surface of the IMD layer 114), the bottom of the trench 120, and along the sidewalls of the trench 120 and vias 122, during the etch-back process. Because the thickness of the first barrier layer 130 along the bottom of the via 122 is typically about 30% to about 60% of the thickness of the first barrier layer 130 on the field surfaces, the etch-back process may completely remove the first barrier layer 130 along the bottom of the vias 122 while leaving a portion of the first barrier layer 130 elsewhere.

In another embodiment, the first barrier layer 130 may be etched using an etch-deposition process. Generally, the etch-deposition process may be performed in the same process chamber as the deposition chamber and utilizes a lower DC power and a higher substrate bias. This combination causes the argon plasma to etch the wafer and generate, for example, tantalum neutrals to deposit onto the wafer during the etch-back process. In this embodiment, the net effect of the etching and deposition is a higher etch rate along the via 122 bottom and a lower etch rate elsewhere. Therefore, the first barrier layer 130 may be removed along the bottom of the vias 122 while leaving a portion of the first barrier layer 130 along the other surfaces.

Additionally, it should be noted that in this embodiment it is preferred that at least a portion of the first barrier layer 130 remain along the bottom of the trench 120, even in the situation in which the first barrier layer 130 is completely removed along the bottom of the via 122. Leaving at least a portion of the first barrier layer 130 along the bottom of the trench prevents or reduces impurity inter-diffusion from the dielectric, e.g., the IMD layer 114, to the conductive layer.

Figure 1E:
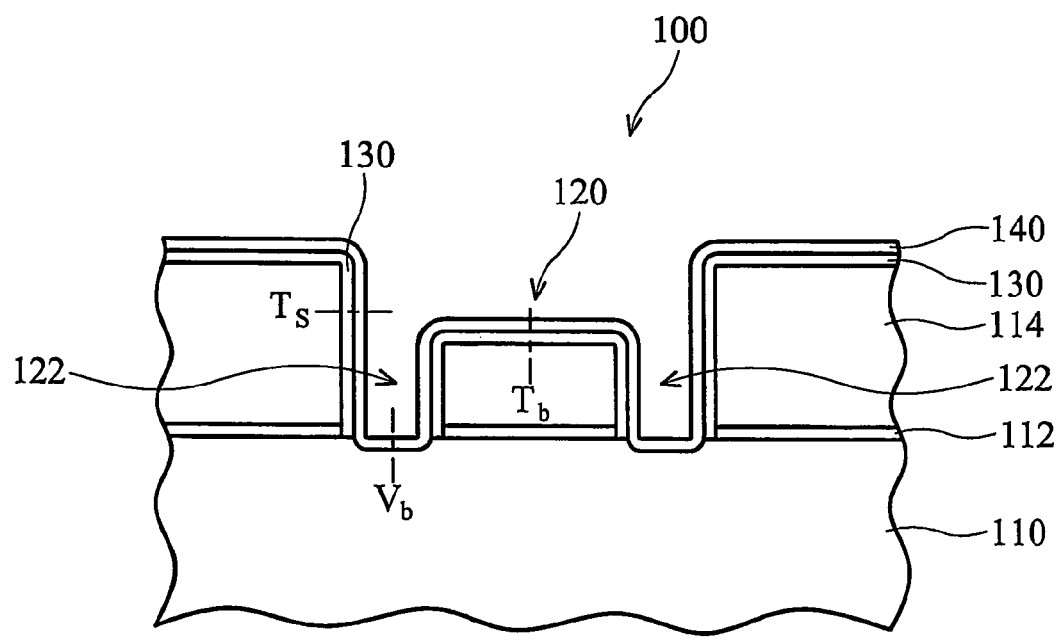

Referring now to FIG. 1e, a second barrier layer 140 is formed. The second barrier layer 140 preferably comprises a conductive material, such as a silicon-containing layer, carbon-containing layer, nitrogen-containing layer, hydrogen-containing layer, or a metal or a metal compound containing layer, such as tantalum, tantalum nitride, titanium, titanium nitride, titanium zirconium, titanium zirconium nitride, tungsten, tungsten nitride, cobalt, nickel, ruthenium, palladium, alloys, or combinations thereof, but more preferably, tantalum nitride. The second barrier layer 140 is preferably formed by a process such as physical vapor deposition (PVD) or other suitable methods. In a preferred embodiment, the second barrier layer 140 comprises tantalum (or a metallic material having good adhesion properties with the conductive material (e.g., copper) used to fill the opening in subsequent steps) formed by a PVD process to a thickness of about 20 Å to about 200 Å.

An optional etch back process may be performed to etch back portions of the second barrier layer 140 and/or the first barrier layer 130. The optional etch back may be particularly useful in situations in which it is desirable to reduce the content resistance along the bottom of the vias 122. In this situation, an etch process or an etch/deposition process may be performed to completely or partially etch the first barrier layer 130 and/or the second barrier layer 140 along the bottom of the vias 122.

It has been found that to achieve better step coverage on the sidewall and to achieve good resistivity properties along the bottom of the via 122, the combined thickness of the first barrier layer 130 and the second barrier layer 140 should be controlled. For example, it is preferred that the ratio of the combined thickness of the first barrier layer 130 and the second barrier layer 140 at a point along the sidewall of the opening approximately midway between the bottom of the trench 120 and the top of the IMD layer 114 to the combined thickness of the first barrier layer 130 and the second barrier layer 140 along the bottom of the vias 122 (or the thickness of the first barrier layer 140 in the embodiment in which the first barrier layer 130 is removed along the bottom of the vias 122) is greater than about 1.0. Referring to FIG. 1e, the ratio of $T_s/V_b$ is preferably greater than about 1.0. In an embodiment, $T_s$ is preferably less than about 110 Å and $V_b$ is preferably less than about 90 Å.

Furthermore, it is also preferred that the ratio of to the combined thickness of the first barrier layer 130 and the second barrier layer 140 at a point along the sidewall of the opening approximately midway between the bottom of the trench 120 and the top of the IMD layer 114 to the combined thickness of the first barrier layer 130 and the second barrier layer 140 along the bottom of the trench is greater than about 0.55. Referring to FIG. 1e, the ratio of $T_s/T_b$ is preferably greater than about 0.55. In an embodiment $T_s$ is preferably less than about 110 Å, and $T_b$ is preferably less than about 100 Å.

Figure 1F:
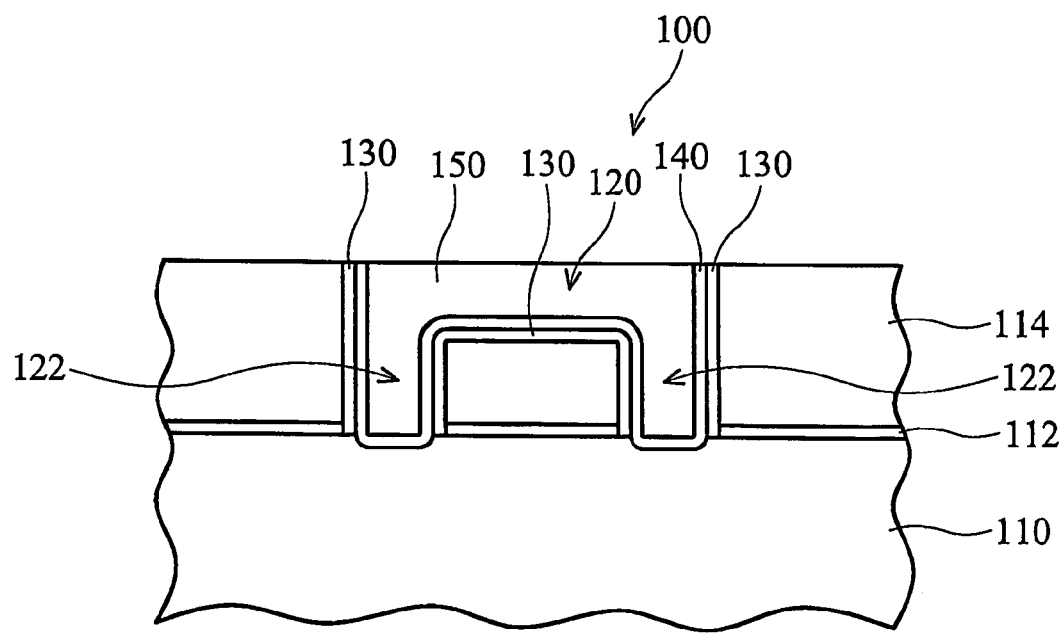

FIG. 1f illustrates the substrate 100 after the trench 120 and vias 122 are filled with a conductive plug 150 and the surface is planarized. In an embodiment, the conductive plug 150 comprises a copper material formed by depositing a copper seed layer and forming a copper layer via an electroplating process. The wafer may be planarized by, for example, a chemical-mechanical polishing (CMP) process.

Thereafter, standard processes may be used to complete fabrication and packaging of the semiconductor device.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a conductive layer;
   a dielectric layer over the conductive layer;
   an opening formed in the dielectric layer, the opening comprising a via and a trench, at least a portion of the via being over the conductive layer, the conductive layer having a recess under the via;
   a plurality of barrier layers formed over the dielectric layer in the opening; and
   a conductive plug formed over the barrier layers within the opening wherein a ratio of a first thickness of the barrier layers along a point approximately midway between a bottom of the trench and a top of the dielectric layer to a second thickness of the barrier layers along a bottom of the via is greater than about 1.0, wherein the plurality of barrier layers includes at least a first barrier layer and a second barrier layer, the first barrier layer formed on the dielectric layer and the second barrier layer formed on the first barrier layer along sidewalls of the opening and the bottom of the trench, at least the second barrier layer positioned along the bottom of the via.

2. The semiconductor device of claim 1, wherein the barrier layers comprise a silicon-containing layer, a carbon-containing layer, a nitrogen-containing layer; a hydrogen-containing layer, a metal or a metal compound containing layer, tantalum, tantalum nitride, titanium, titanium nitride, titanium zirconium, titanium zirconium nitride, cobalt, nickel, ruthenium, palladium, tungsten, tungsten nitride, or combinations thereof.

3. The semiconductor device of claim 1, wherein a width of the via is less than about 0.14 μm.

4. The semiconductor device of claim 1, wherein a width of the trench is less than about 1.3 times a width of the via.

5. The semiconductor device of claim 1, wherein the first thickness is less than about 110 Å.

6. The semiconductor device of claim 1, wherein the second thickness is less than about 90 Å.

7. The semiconductor device of claim 1, wherein the first barrier layer of the plurality of barrier layers is formed by physical vapor deposition techniques, the first barrier layer being in contact with the dielectric layer.

8. A semiconductor device comprising:
a conductive layer;
a dielectric layer over the conductive layer;
an opening formed in the dielectric layer, the opening comprising a via and a trench, at least a portion of the via being over the conductive layer, the conductive layer having a recess under the via;
a plurality of barrier layers formed over the dielectric layer in the opening; and
a conductive plug formed over the barrier layers within the opening, wherein a ratio of a first thickness of the barrier layers along a point approximately midway between a bottom of the trench and a top of the dielectric layer to a second thickness of the barrier layers along the bottom of the trench is greater than about 0.55, wherein the plurality of barrier layers includes at least a first barrier layer formed along sidewalls of the opening and the bottom of the trench and a second barrier layer formed on the first barrier layer and on a bottom of the via.

9. The semiconductor device of claim 8, wherein the barrier layers comprise a silicon-containing layer, a carbon-containing layer, a nitrogen-containing layer, a hydrogen-containing layer, a metal or a metal compound containing layer, tantalum, tantalum nitride, titanium, titanium nitride, titanium zirconium, titanium zirconium nitride, cobalt, nickel, ruthenium, palladium, tungsten, tungsten nitride, or combinations thereof.

10. The semiconductor device of claim 8, wherein a width of the via is less tan about 0.14 μm.

11. The semiconductor device of claim 8, wherein a width of the trench is less than about 1.3 times a width of the via.

12. The semiconductor device of claim 8, wherein the first thickness is less than about 110 Å.

13. The semiconductor device of claim 8, wherein the second thickness is less than about 100 Å.

14. The semiconductor device of claim 8, wherein the first barrier layer of the plurality of barrier layers is formed by physical vapor deposition techniques, the first barrier layer being in contact with the dielectric layer.

15. A semiconductor device comprising:
a dielectric layer;
an opening formed in the dielectric layer, the opening comprising a via and a trench;
a first barrier layer formed along a bottom of the trench and along sidewalls of the via and trench;
a second barrier layer formed over the first barrier layer and along a bottom of the via;
a conductive plug formed over the second barrier layer within the opening, wherein a ratio of a first thickness of the barrier layers along a point approximately midway between the bottom of the trench and a top of the dielectric layer to a second thickness of the barrier layers along the bottom of the trench is greater than about 0.55, and a conductive layer under the dielectric layer, the conductive layer having a recess formed under the via.

16. The semiconductor device of claim 15, wherein a width of the via is less than about 0.14 μm.

17. The semiconductor device of claim 15, wherein a width of the trench is less than about 1.3 times a width of the via.

* * * * *